(12) United States Patent
Hsu

(10) Patent No.: US 6,658,764 B2
(45) Date of Patent: Dec. 9, 2003

(54) APPARATUS AND METHOD FOR PREVENTING DROPLETS ON WAFERS DURING SOLVENT DRYING PROCESS

(75) Inventor: Feng Chia Hsu, Kaoshiung (TW)

(73) Assignee: Taiwan Semiconductor Manufacturing Co. Ltd., Hsin Chu (TW)

( * ) Notice: Subject to any disclaimer, the term of this patent is extended or adjusted under 35 U.S.C. 154(b) by 0 days.

(21) Appl. No.: 10/143,228

(22) Filed: May 10, 2002

(65) Prior Publication Data

US 2003/0208922 A1 Nov. 13, 2003

(51) Int. Cl.[7] .................................................. F26B 3/04
(52) U.S. Cl. ................................ 34/468; 34/469; 34/73
(58) Field of Search ............................ 34/468, 74, 73, 34/75, 467, 409, 470, 480, 78

(56) References Cited

U.S. PATENT DOCUMENTS

| | | | | |
|---|---|---|---|---|
| 3,904,102 A | * | 9/1975 | Chu et al. | 228/180 |
| 4,213,306 A | * | 7/1980 | Peabody et al. | 62/85 |
| 4,868,996 A | * | 9/1989 | Ohmori et al. | 34/13 |
| 5,855,077 A | * | 1/1999 | Nam et al. | 34/409 |
| 5,950,328 A | * | 9/1999 | Ichiko et al. | 34/364 |
| 6,412,501 B1 | * | 7/2002 | Onoda et al. | 134/95.2 |
| 6,519,869 B2 | * | 2/2003 | Peng | 34/487 |

* cited by examiner

*Primary Examiner*—Ira S. Lazarus
*Assistant Examiner*—Camtu Nguyen
(74) *Attorney, Agent, or Firm*—Tung & Associates

(57) ABSTRACT

An apparatus and a method for preventing solvent droplets from falling on wafers during a solvent drying process of a semiconductor wafer. The apparatus is constructed by a body having a cavity therein for holding a wafer, means for introducing a solvent vapor in the cavity, a plurality of condenser coils on an inside wall of the cavity, and a plurality of condensing plates attached to the plurality of condenser coils on a surface facing the wafer for condensing solvent vapor and flowing condensed solvent into a reservoir thus preventing solvent droplets from falling on the wafer surface.

19 Claims, 3 Drawing Sheets

APPARATUS AND METHOD FOR PREVENTING DROPLETS ON WAFERS DURING SOLVENT DRYING PROCESS

FIELD OF THE INVENTION

The present invention generally relates to an apparatus and a method for drying semiconductor wafers in a solvent dryer and more particularly, relates to an apparatus and a method for preventing solvent droplets from falling on wafers during a solvent drying process in the solvent dryer.

BACKGROUND OF THE INVENTION

In the fabrication of semiconductor devices, a large quantity of deionized (DI) water is frequently used to clean wafers in a wet bench process. For instance, when residual chemical must be removed from the surface of a wafer, DI water rinse is used in the wet bench process to perform major wafer cleaning operations such as quick-dump-rinse and cascade overflow rinse. It is desirable that the surface of the wafer be cleaned by DI water after a chemical or polishing process has been conducted on the wafer, i.e. oxide or nitride deposition, etching or chemical mechanical polishing process. The wet bench wafer cleaning step can be accomplished by equipment that is installed either in-line or in a batch-type process.

A typical automated wafer scrubber combines brush and solution scrubbing by DI water. The scrubber utilizes a hyperbolic high-pressure spray of DI water with a retractable cleaning brush. A typical wafer scrubbing process consists of a DI water spray step followed by a spin dry and nitrogen gas blow dry step. More recently, the solvent drying technology such as the use of isopropyl alcohol (IPA) has been developed to further improve the drying technology.

In a solvent drying technology, such as one that utilizes IPA shown in FIG. 1, the drying process is conducted in a static manner, i.e., with the wafer positioned statically without movement. The wafer dryer 10 is constructed of a drying tank 12 equipped with a wafer receptacle 14, a chiller 16, a sidewall heater 18 and a bottom heater 20. A cleaned and wet wafer is transported into the drying tank 12, or the vapor chamber. Vapor of IPA is transported into the chamber cavity 22 by a carrier gas such as a high purity nitrogen, or any other high purity inert gas. The vapor enters into cavity 22 is heated by the bottom heater 20 such that IPA is further vaporized and rises into the cavity 22.

The wafer 24 is surrounded by the IPA vapor and, due to the high volatility of IPA, water on the wafer surface can be evaporated away without leaving any water mark, contaminating particles or metal particles. The vapor pressure of IPA can be suitably adjusted such that there is a steady flow of IPA vapor in the cavity 22 fed from the IPA reservoir tank 26.

In the conventional IPA dryer 10 shown in FIG. 1, the only moving part for transferring wafers into and out of the chamber cavity is a robot arm. There are no other moving parts that can produce contaminating particles. The IPA drying chamber can thus be kept in an extremely clean condition to avoid any contamination of the wafer surface. To further maintain the cleanliness of the chamber cavity 22, an air filter 28 is utilized for filtering incoming air into the cavity 22 and for providing a suitable flow rate of the IPA vapor. After the cleaning process is completed, the water-containing IPA vapor is condensed by the chiller 16 into IPA liquid and is collected at the bottom of the drying chamber 12 for recycling and reuse by the process. The IPA vapor drying process is normally controlled by three major parameters, i.e. the purity and the water content of IPA; the flow rate and flow speed of the IPA vapor; and the cleanliness of the IPA vapor.

Another solvent drying technique has been developed in recent years which is similar in principal to that described. In a Maragoni dryer, the drying principal is based on the different surface tensions of IPA and DI water. The different surface tensions cause the ejection of water molecules from the wafer surface which are then collected by a reservoir in the drying apparatus. The Maragoni drying process is carried out by slowly withdrawing a wafer from a DI water tank immersed in DI water. At the same time, IPA vapor carried by $N_2$ carrier gas is flown onto the wet wafer surface such that IPA is saturated on the exposed wafer surface above the water level. Since the concentration of IPA on the surface of the exposed wafer is larger than the concentration of DI water, the surface tension of IPA is smaller than the surface tension of water in the water tank. This causes water molecules on the surface of the exposed wafer to be retracted into the water tank and thus achieving the drying purpose.

A typical Maragoni dryer 40 is shown in FIG. 2. The Maragoni dryer 40 is constructed by an upper chamber section 52, a lower chamber section 44 which is also an outer tank, an inner tank 42 for holding a volume of DI water 62 therein, a drain conduit 50 in fluid communication with the outer chamber 44, a wafer carrier 46 for carrying a plurality of semiconductor wafers 60, an elevator means 48 for raising and lowering the wafer carrier 46 into and out of the volume of DI water 62, and a tank cover, or lid member 54. The outer tank 44 is formed by a tank wall 68 defining a cavity 56 therein for receiving an overflow of DI water 62 from the inner tank 42 when the wafer cassette 46 is lowered into the volume of DI water 62. The inner tank 42 is defined by sidewall 72 for holding the volume of DI water 62 therein. A cavity 58 is formed when the wafer carrier 46 is lowered into the volume of DI water 62 and the tank cover 54 is slid over the top of the inner tank 42 forming a hermetically sealed chamber.

In either the solvent dryer or the maragoni dryer, a chiller arrangement may be utilized to condensed, collect and recycle the solvent vapor. This is shown in FIG. 1 as chiller 16 which condenses the water-containing IPA vapor into IPA liquid such that it may be collected at the bottom of the drying chamber 12 for recycling and reuse. The chiller 16 is constructed of a plurality of condenser coils which are kept at a temperature below the vaporization temperature of the solvent. The plurality of condenser coils 70 are shown in FIG. 3. The solvent dryer 74 shown in FIG. 3 is similar to that shown in FIG. 1 with the chamber cavity shown in an enlarged view. A processing problem occurred when condensed solvent droplets 76 fall from the condenser coils 70 onto the surface of wafer 24 during the vapor drying process. The solvent droplets, when fall on the wafer surface, can cause severe contamination of the wafer.

It is therefore an object of the present invention to provide a solvent dryer for drying semiconductor wafers that does not have the drawbacks or shortcomings of the conventional solvent dryers.

It is another object of the present invention to provide a solvent dryer that is equipped with condenser coils and drip-proof guards for preventing solvent condensation from falling on the wafer.

It is a further object of the present invention to provide a solvent dryer for semiconductor wafers that is equipped with a plurality of condensing plates attached to a plurality of condenser coils.

It is another further object of the present invention to provide a solvent dryer for semiconductor wafers that is equipped with a plurality of condensing plates which are kept at a temperature below the vaporization temperature of the solvent.

It is still another object of the present invention to provide a method for preventing solvent droplets from falling on wafers during a solvent drying process for semiconductor wafers.

SUMMARY OF THE INVENTION

In accordance with the present invention, an apparatus and a method for preventing solvent droplets from falling on semiconductor wafers during a solvent drying process are provided.

In a preferred embodiment, a solvent dryer equipped with condenser coils and drip-proof guards is provided which includes a cavity for holding a wafer therein; means for introducing a solvent vapor in the cavity; a plurality of condenser coils positions on an inside wall of the cavity; and a plurality of condensing plates affixed to the plurality of condenser coils on a surface facing the wafer for condensing solvent vapor and flowing condensed solvent into a reservoir thus preventing solvent droplets from falling on the wafer.

In the solvent dryer that is equipped with condenser coils and drip-proof guards, the means for introducing a solvent vapor further includes a quantity of solvent that has a vapor pressure at least that of isopropyl alcohol stored at the bottom portion of the cavity; and heating means for heating the quantity of solvent to a temperature above a vaporization temperature of the solvent. The means for introducing a solvent vapor in the cavity may further include an exterior solvent vapor generating means and a conduit for flowing the solvent vapor into the cavity. The plurality of condenser coils may be arranged parallelly on the inside wall of the cavity. The plurality of condenser coils may be fabricated of a ceramic material, or may be fabricated of quartz. The plurality of condenser coils may further include a coolant flown therethrough for keeping the plurality of condenser coils at a temperature below the vaporization temperature of the solvent. The plurality of condensing plates may be formed of a ceramic material substantially similar to the material that forms the plurality of condenser coils, or the plurality of condensing plates may be formed of quartz. The plurality of condensing plates may be fused to the plurality of condenser coils. Each of the plurality of condensing plates may be fixed to the plurality of condenser coils in a direction perpendicular to the bottom of the solvent dryer, or may be fixed to the plurality of condenser coils in a tilted manner with a bottom of a condensing plate tilting away from the plurality of condenser coils. The solvent vapor may have a vapor pressure at 25° C. at least that of isopropyl alcohol.

The present invention is further directed to a method for drying a wafer in a solvent dryer which can be carried out by the operating steps of providing a solvent dryer that is equipped with a cavity for holding a wafer therein, means for introducing a solvent vapor in the cavity, a plurality of condenser coils positioned on an inside wall of the cavity, and a plurality of condensing plates affixed to the plurality of condenser coils on a surface facing the wafer; positioning a wafer that has water molecules on its surface in the cavity; introducing a solvent vapor in the cavity and drying the wafer; and condensing solvent vapor that contains water molecules on surfaces of the plurality of condensing plates and collecting in a reservoir.

The method for drying a wafer in a solvent dryer may further include the step of forming the plurality of condenser coils and the plurality of condensing plates in a ceramic material. The method may further include the step of fusing each of the plurality of condensing plates to a plurality of condenser coils, or the step of flowing a coolant of not higher than 20° C. through the plurality of condenser coils. The method may further include the step of cooling the plurality of condensing plates to a temperature of not higher than 20° C., and preferably to a temperature of not higher than 17° C. The method may further include the step of introducing a solvent vapor from a solvent that has a vapor pressure at 25° C. at least that of isopropyl alcohol, or the step of introducing a solvent vapor from isopropyl alcohol.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses an apparatus and a method for preventing solvent droplets from falling on wafers during a solvent drying process for a semiconductor wafer. The apparatus and the method are applicable to solvent dryers of any type as long as a volatile solvent is used in the dryer, however, the apparatus and the method are particularly suited for solvent dryers that utilize a solvent that has a vapor pressure at least that of isopropyl alcohol.

The present invention solvent dryer that is equipped with condenser coils and drip-proof guards can be constructed by the essential elements of a cavity for holding a semiconductor wafer therein, and interior or exterior means for introducing a solvent vapor into the cavity, a plurality of condenser coils that are positioned on an inside wall of the cavity for recycling the solvent, and a plurality of condensing plates which are affixed to the plurality of condenser coils on a surface of the coils facing the wafer. Solvent vapor is condensed on the plurality of condensing plates which are kept at a temperature below the vaporization temperature of the solvent; and then collected by a solvent reservoir for recycling and reuse. The apparatus therefore prevents solvent droplets from falling on the semiconductor wafer, and thus prevents a serious contamination problem for the wafer.

Figure 1:
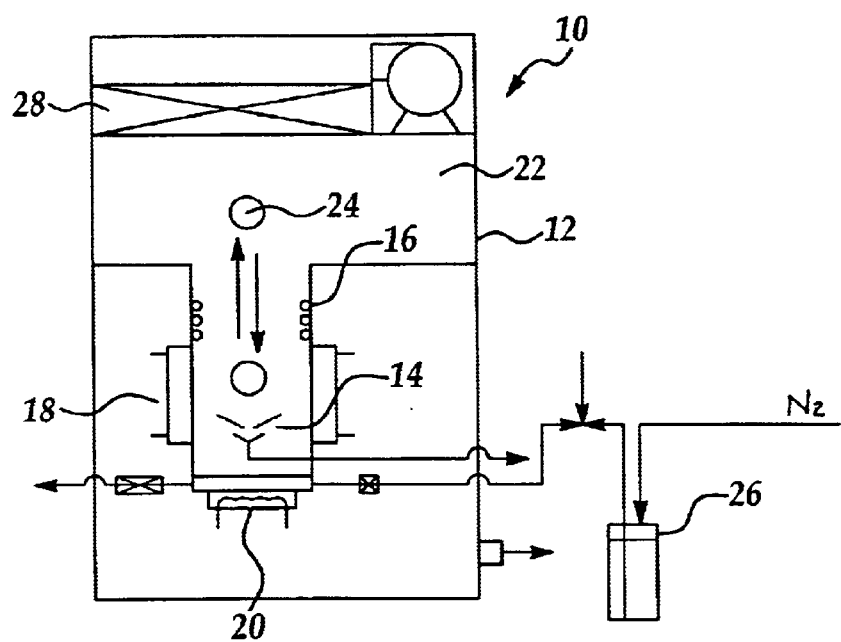
FIG. 1 is a schematic illustrating a conventional solvent drying system for semiconductor wafers.
Figure 2:
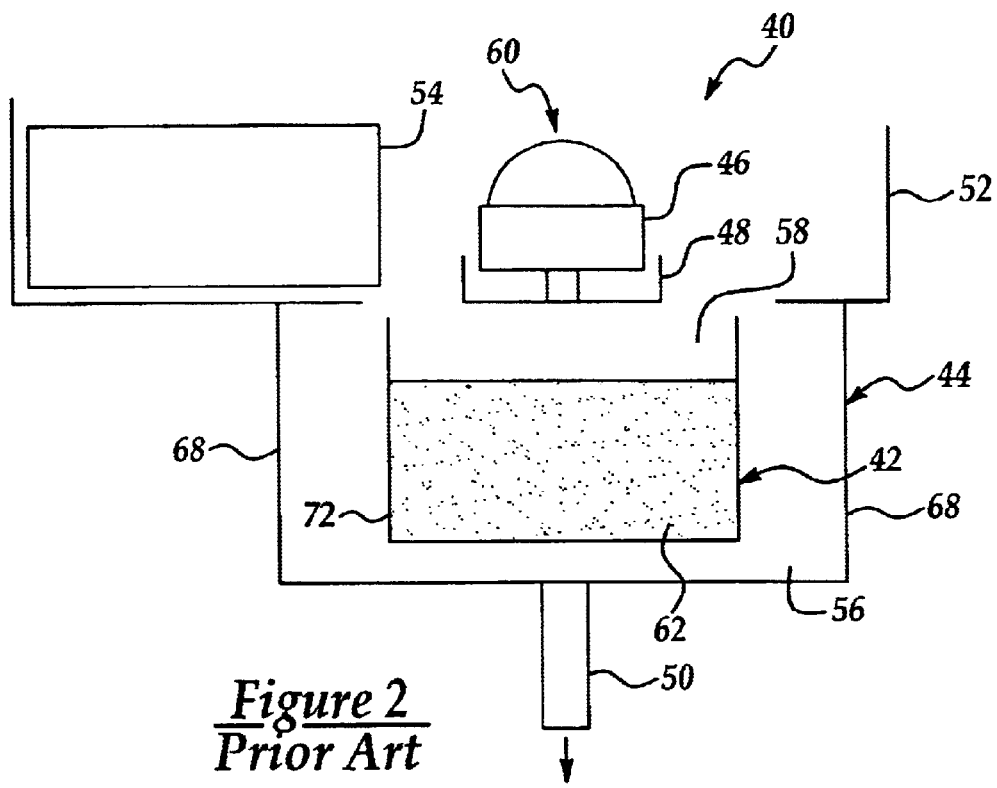
FIG. 2 is a schematic illustrating another conventional solvent drying system for semiconductor wafers.
Figure 3:
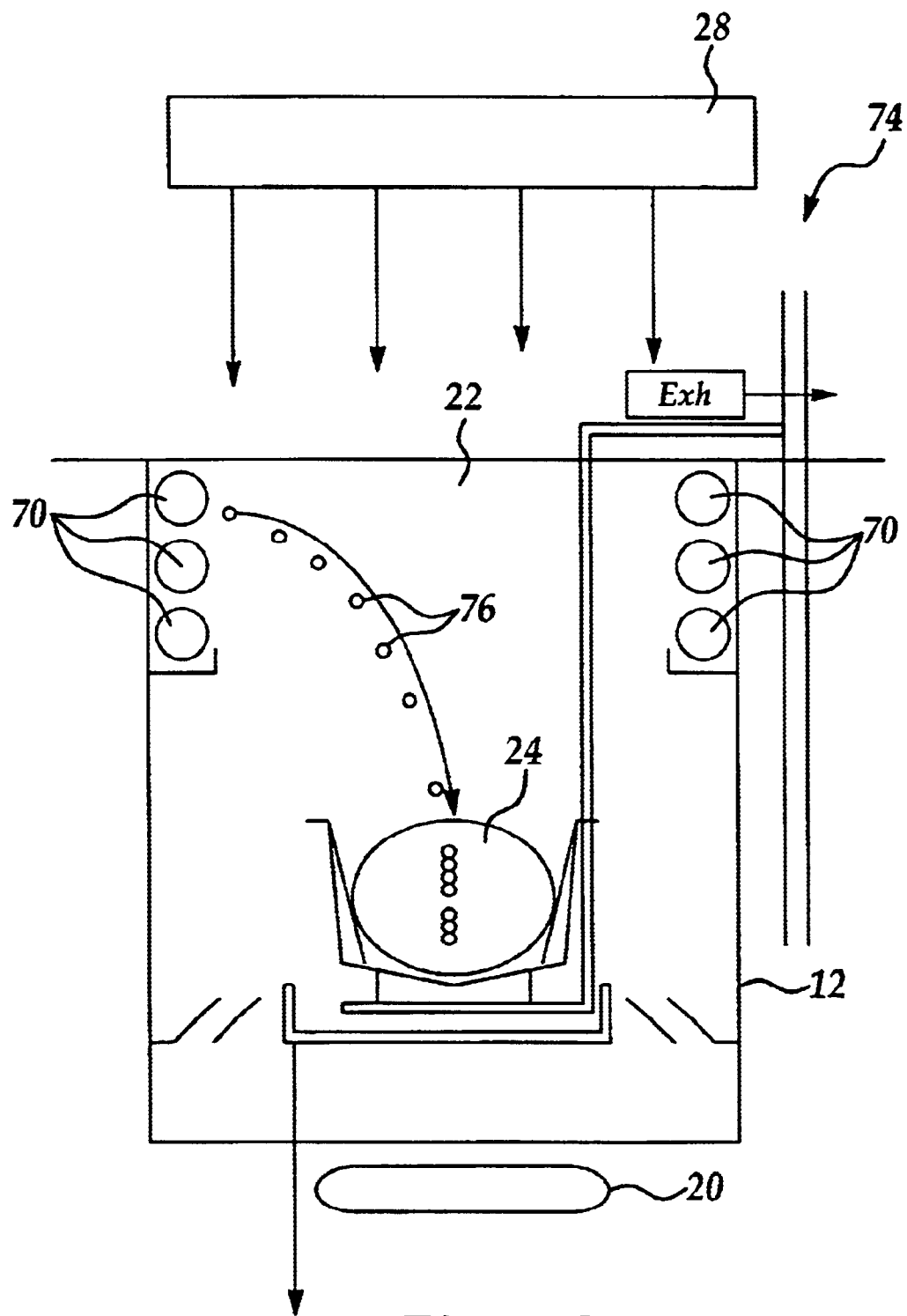
FIG. 3 is a schematic illustrating the problem of falling solvent droplets onto the wafer during a solvent drying process conducted in the conventional solvent dryer.
Figure 4:
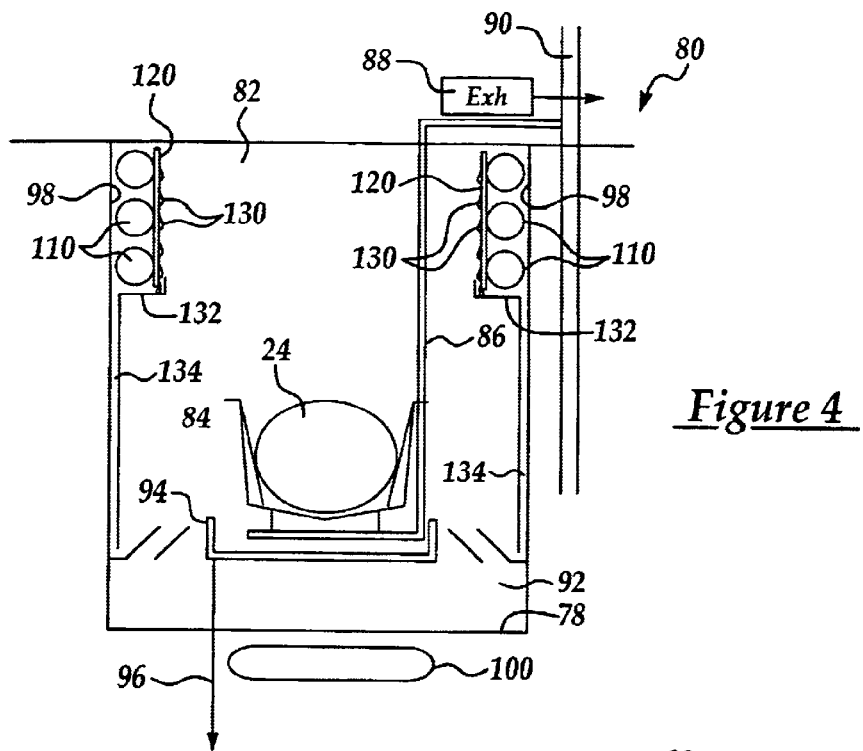
FIG. 4 is a schematic of the present invention solvent drying apparatus equipped with condenser coils and drip-proof guards for drying semiconductor wafers.
Figure 5:
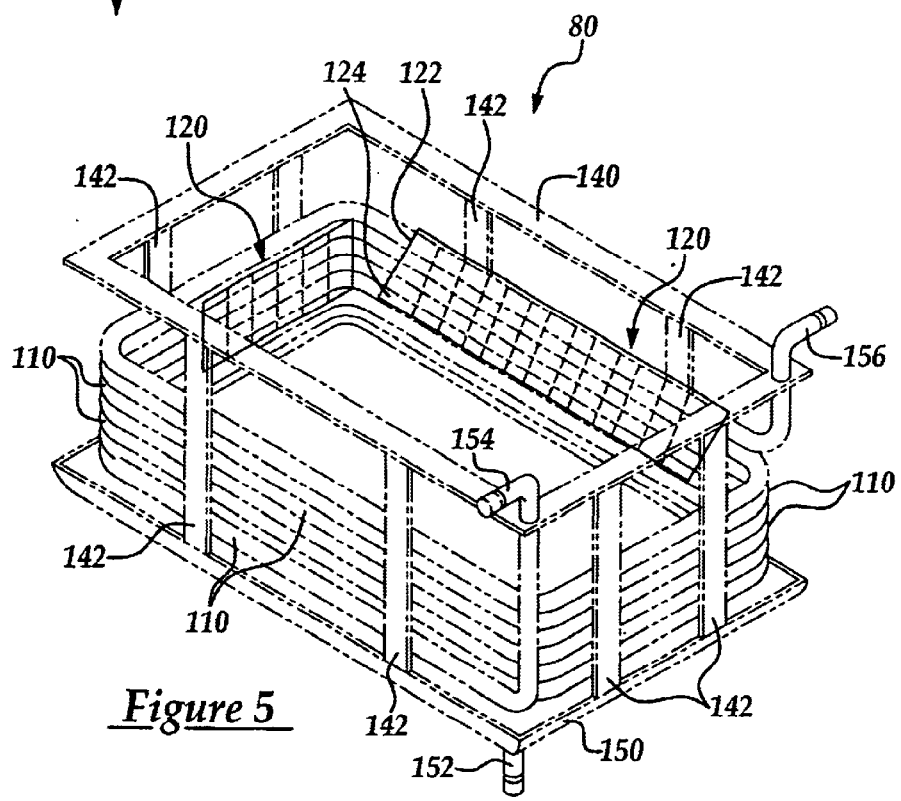
FIG. 5 is an exploded, perspective view of the present invention apparatus for drying wafers equipped with condenser coils and drip-proof guards.

A schematic of a cross-sectional view of the present invention novel apparatus 80 is shown in FIG. 4, while an exploded perspective view of the apparatus 80 is shown in FIG. 5. The apparatus 80 is constructed of a cavity 82 for holding a wafer 24 in a wafer holder 84. The wafer holder 84, in turn, may be positioned on an elevator device 86 which may be lifted or lowered into the cavity 82. An exhaust means 88 is further provided to ventilate the solvent dryer to a factory exhaust system 90. At the bottom portion of the cavity 82, is provided a means for introducing a solvent vapor into the cavity 82. In the embodiment shown in FIG. 4, the means for introducing solvent vapor consists of a quantity of solvent 92 that is stored at the bottom portion of the cavity 82. The solvent 92 should have a vapor pressure at 25° C. at least that of isopropyl alcohol such that, water molecules on the surface of the wafer 24 may be driven off by the highly volatile solvent vapor. The means for introducing a solvent vapor in the preferred embodiment solvent dryer 80 shown in FIG. 4 further includes a heating means 100 which is capable of heating a quantity of solvent 92 to a temperature above a vaporization temperature of the solvent. A drain reservoir 94 is provided to collect condensed solvent and deliver through a conduit 96 to a tank for recycling and reuse.

In the present invention solvent dryer 80, a plurality of cooling coils 110 are further provided and arranged on an inside wall 98 of the dryer 80. It should be noted that the condenser coils 110 are shown in FIG. 4 for illustration purpose and 20 therefore, are not drawn to scale. To prevent solvent vapor from condensing on the condenser coils 110 and then ejected onto the surface of wafer 24, the present invention dryer 80 provides a plurality of condensing plates 120 which are attached, or affixed to the plurality of condenser coils 110. The condensing plates 120 may be advantageously fabricated of the same material as that used in fabricating the condenser coils, for instance, of a ceramic material. In the preferred embodiment, the plurality of condensing plates 120 and the plurality of condenser coils 110 are fabricated of quartz. When both the plurality of condensing plates 120 and the plurality of condenser coils 110 are fabricated of quartz, the It condensing plates 120 can be advantageously fused to the condenser coil 110 at a temperature above the melting temperature of quartz. The plurality of condenser coils 110 may be provided with a diameter between about 5 mm and about 50 mm, while the plurality of condensing plates 120 may be provided in a thickness between about 5 mm and about 10 mm.

It should be noted that, while in FIG. 4, the condensing plates 120 are fixed to the condenser coils 110 in a vertical manner, i.e., the condensing plates 120 are perpendicular to a bottom wall 78 of the apparatus 80, the condensing plates 120 may also be attached to the condenser coils 110 in a tilted manner, such as that shown in FIG. 5. When the condensing plates 120 are mounted to the condenser coils 110 in a tilted manner, the top portion 122 is normally fused to the condenser coil 110, while the bottom portion 124 of the condensing plate 120 is tilted away from the condenser coils 110.

In either the vertical arrangement or the tilted arrangement, the solvent condensates in droplets 130 may be collected by a drain collector 132 and delivered to the bottom portion of the cavity 82 through a conduit 134.

The exploded, perspective view of the present invention apparatus 80, shown in FIG. 5, further shows a top supporting bracket 140, a plurality of side supporting brackets 142, a bottom drain collector 150, complete with a drain pipe 152, a coolant inlet 154 and a coolant outlet 156.

By utilizing the present invention condensing plates 120, the solvent droplets 130 are collected by the drain collector 132 and thus, any splatter or ejection of solvent droplets 130 onto the surface of wafer 24 can be avoided. A major source of contamination is thus eliminated.

The present invention novel apparatus and method for preventing solvent droplets from falling on semiconductor wafers during a solvent drying process have therefore been amply described in the above description and in the drawings of FIGS. 4 and 5.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

What is claimed is:

1. A solvent dryer equipped with condenser coils and drip-proof guards comprising:
   a cavity for holding a wafer therein;
   means for introducing a solvent vapor in said cavity;
   a plurality of condenser coils positioned on an inside wall of said cavity; and
   a plurality of condensing plates affixed to said plurality of condenser coils on a surface facing said wafer for condensing solvent vapor and flowing condensed solvent into a reservoir and preventing solvent droplets from falling on said wafer.

2. A solvent dryer equipped with condenser coils and drip-proof guards according to claim 1, wherein said means for introducing a solvent vapor in said cavity comprises:
   a quantity of solvent having a vapor pressure at least that of isopropyl alcohol stored at said bottom portion of the cavity; and
   a heating means for heating said quantity of solvent to a temperature above a vaporization temperature of said solvent.

3. A solvent dryer equipped with condenser coils and drip-proof guards according to claim 1, wherein said plurality of condenser coils are arranged parallelly on said inside wall of the cavity.

4. A solvent dryer equipped with condenser coils and drip-proof guards according to claim 1, wherein said plurality of condenser coils are fabricated of a ceramic material.

5. A solvent dryer equipped with condenser coils and drip-proof guards according to claim 1, wherein said plurality of condenser coils are fabricated of quartz.

6. A solvent dryer equipped with condenser coils and drip-proof guards according to claim 1, wherein said plurality of condenser coils further comprising a coolant flown therethrough for maintaining said plurality of condenser coils at a temperature below the vaporization temperature of said solvent.

7. A solvent dryer equipped with condenser coils and drip-proof guards according to claim 1, wherein said plurality of condensing plates being formed of a ceramic material substantially similar to a material that forms the plurality of condenser coils.

8. A solvent dryer equipped with condenser coils and drip-proof guards according to claim 1, wherein said plurality of condensing plates being formed of quartz.

9. A solvent dryer equipped with condenser coils and drip-proof guards according to claim 1, wherein said plurality of condensing plates are fused to said plurality of condenser coils.

10. A solvent dryer equipped with condenser coils and drip-proof guards according to claim 1, wherein each of said plurality of condensing plates being affixed to said plurality of condenser coils in a direction perpendicular to a bottom of said solvent dryer.

11. A solvent dryer equipped with condenser coils and drip-proof guards according to claim 1, wherein each of said plurality of condensing plates being affixed to said plurality of condenser coils in a tilted manner with a bottom of a condensing plate tilting away from said plurality of condenser coils.

12. A solvent dryer equipped with condenser coils and drip-proof guards according to claim 1, wherein said solvent vapor having a vapor pressure at 25° C. at least that of isopropyl alcohol.

13. A method for drying a wafer in a solvent dryer comprising the steps of:
  providing a solvent dryer equipped with:
    a body having a cavity for holding a wafer therein,
    a means for introducing a solvent vapor in said cavity, and
    a plurality of condensing plates affixed to said plurality of condenser coils on a surface facing said wafer;
  flowing a coolant of not higher than 20° C. through said plurality of condenser coils;
  positioning a wafer having water molecules on its surface in said cavity;
  introducing a solvent vapor in said cavity and drying said wafer; and
  condensing solvent vapor that contains water molecules on surfaces of said plurality of condensing plates and collecting in a reservoir.

14. A method for drying a wafer in a solvent dryer according to claim 13 further comprising the step of forming said plurality of condenser coils and said plurality of condensing plates in a ceramic material.

15. A method for drying a wafer in a solvent dryer according to claim 14 further comprising the step of fusing each of said plurality of condensing plates to a plurality of condenser coils.

16. A method for drying a wafer in a solvent dryer according to claim 13 further comprising the step of cooling said plurality of condensing plates to a temperature of not higher than 20° C.

17. A method for drying a wafer in a solvent dryer according to claim 13 further comprising the step of cooling said plurality of condensing plates preferably to a temperature of not higher than 17° C.

18. A method for drying a wafer in a solvent dryer according to claim 13 further comprising the step of introducing a solvent vapor from a solvent that has a vapor pressure at 25° C. at least that of isopropyl alcohol.

19. A method for drying a wafer in a solvent dryer according to claim 13 further comprising the step of introducing a vapor of isopropyl alcohol.

* * * * *